US009899617B2

United States Patent
Kuwabara et al.

(10) Patent No.: US 9,899,617 B2
(45) Date of Patent: Feb. 20, 2018

(54) PRODUCTION METHOD OF HOLE BLOCKING LAYER, HOLE BLOCKING LAYER, PHOTOELECTRIC CONVERSION ELEMENT, PHOTOELECTRIC CONVERSION DEVICE, ORGANIC THIN-FILM SOLAR CELL PANEL, AND LIGHT-EMITTING DEVICE

(71) Applicant: Ideal Star Inc., Miyagi (JP)

(72) Inventors: Takayuki Kuwabara, Ishikawa (JP); Morihiko Saida, Miyagi (JP); Kenji Omote, Miyagi (JP); Kohshin Takahashi, Ishikawa (JP)

(73) Assignee: Ideal Star Inc., Miyagi (JP)

( * ) Notice: Subject to any disclaimer, the term of this patent is extended or adjusted under 35 U.S.C. 154(b) by 76 days.

(21) Appl. No.: 14/195,294

(22) Filed: Mar. 3, 2014

(65) Prior Publication Data

US 2014/0174512 A1    Jun. 26, 2014

Related U.S. Application Data

(63) Continuation of application No. PCT/JP2012/071606, filed on Aug. 27, 2012.

(30) Foreign Application Priority Data

Sep. 1, 2011 (JP) ................................ 2011-190743

(51) Int. Cl.
*H01L 51/50* (2006.01)
*H01L 51/44* (2006.01)
*B82Y 10/00* (2011.01)
*H01L 51/00* (2006.01)
*H01L 51/42* (2006.01)

(52) U.S. Cl.
CPC ............ *H01L 51/44* (2013.01); *B82Y 10/00* (2013.01); *H01L 51/0007* (2013.01);
(Continued)

(58) Field of Classification Search
CPC ............ H01L 51/0036; H01L 51/0047; H01L 51/4253; H01L 51/4273; H01L 51/5096;
(Continued)

(56) References Cited

U.S. PATENT DOCUMENTS

2007/0068569 A1*  3/2007  Nam ................... H01G 9/2022
136/255

FOREIGN PATENT DOCUMENTS

JP    H04-270143 A    9/1992
JP    H05-330823 A    12/1993
(Continued)

OTHER PUBLICATIONS

Schneider et al., "Synthesis, Characterization, Defect Chemistry, and FET Properties of Microwave-Derived Nanoscaled Zinc Oxide", Chem. Mater. 2010, 22, 2203-2212.*
(Continued)

*Primary Examiner* — Golam Mowla
(74) *Attorney, Agent, or Firm* — Osha Liang LLP

(57) ABSTRACT

A production method of a hole blocking layer includes: a liquid layer forming step that causes a liquid composition and a surface of a member on which the hole blocking layer is to be formed, to contact with each other thereby forming a liquid layer comprising the liquid composition on the surface of the member on which the hole blocking layer is to be formed, the liquid composition containing a zinc source comprising bis(acetylacetonato)zinc, a complexing agent comprising acetylacetone, and a polar solvent; and a drying step that heats the liquid layer formed by the liquid layer forming step to vaporize the complexing agent and the polar solvent from the liquid layer thereby forming a hole blocking layer comprising zinc oxide on the surface of the member on which the hole blocking layer is to be formed.

5 Claims, 6 Drawing Sheets

(52) U.S. Cl.
CPC ...... *H01L 51/4273* (2013.01); *H01L 51/5096* (2013.01); *H01L 51/0036* (2013.01); *H01L 51/0047* (2013.01); *H01L 51/4253* (2013.01); *Y02E 10/549* (2013.01); *Y02P 70/521* (2015.11)

(58) Field of Classification Search
CPC ..... H01L 51/0007; H01L 51/44; H01L 31/06; H01L 31/1864; H01L 31/035272; H01L 31/1804
See application file for complete search history.

(56) References Cited

FOREIGN PATENT DOCUMENTS

| JP | 2004-319705 | A  | 11/2004 |
|----|-------------|----|---------|
| JP | 2008-105923 | A  | 5/2008  |
| WO | 2010120393  | A2 | 10/2010 |
| WO | 2011019044  | A1 | 2/2011  |

OTHER PUBLICATIONS

JP 2008-105923 A online machine translation, translated on Jan. 11, 2016.*

Wanli Ma et al.; "Thermally Stable, Efficient Polymer Solar Cells with Nanoscale Control of the Interpenetrating Network Morphology"; Advanced Functional Materials, No. 15, pp. 1617-1622; 2005 (6 pages).
Takayuki Kuwabara, et al.; "Characterization of Inverted-Type Organic Solar Cells with a ZnO Layer as the Electron Collection Electrode by ac Impedance Spectroscopy"; ACS Applied Materials & Interfaces Vo. 1, No. 10, pp. 2017-2110; Sep. 16, 2009 (4 pages).
Yongye Liang et al.; "For the Bright Future—Bulk Heterojunction Polymer Solar Cells with Power Conversion Efficiency of 7.4%"; Advanced Energy Materials vol. 22, pp. E135-E138; 2010 (4 pages)
Noriyuki Hasuike et al.; "Law Temperature Synthesis of ZnO Thin Films by Spin-Coating Process"; The Japan Society of Applied Physics and the Related Societies, Extended Abstracts of the 57th Spring Meeting, pp. 21-029, 18a-TL-2; Mar. 3, 2010 (2 pages).
International Search Report for PCT/JP2012/071606, dated Sep. 25, 2012 (2 pages).
Written Opinion for PCT/JP2012/071606, dated Sep. 25, 2012 (4 pages).
Extended European Search Report in counterpart European Application No. 12826919.8, dated Feb. 26, 2015 (6 pages).
Chih-Yu Chang et al.; "Enhanced Performance and Stability of a Polymer Solar Cell by Incorporation of Vertically Aligned, Cross-Linked Fullerene Nanorods"; Angewandte Chemie International Edition, vol. 50, No. 40, pp. 9386-9390; Aug. 22, 2011 (5 pages).

* cited by examiner

PRODUCTION METHOD OF HOLE BLOCKING LAYER, HOLE BLOCKING LAYER, PHOTOELECTRIC CONVERSION ELEMENT, PHOTOELECTRIC CONVERSION DEVICE, ORGANIC THIN-FILM SOLAR CELL PANEL, AND LIGHT-EMITTING DEVICE

TECHNICAL FIELD

The present invention relates to a production method of a hole blocking layer disposed between an organic semiconductor layer and an electrode to suppress electrical conduction therebetween from being carried by holes, and also to a hole blocking layer, a photoelectric conversion element, a photoelectric conversion device, an organic thin-film solar cell panel, and a light-emitting device.

BACKGROUND ART

Silicon-based solar cells, as mainstream of solar cells at present, exhibit successfully high photoelectric conversion efficiency, but impose large burden on the environment in terms of amount of resources, emission of carbon dioxide during production, and cost etc. In this regard, researches are being conducted worldwide to achieve clean solar cells with less constraint on resources, which may be photoelectric conversion elements using organic semiconductor materials, in particular so-called organic thin-film solar cells configured such that organic semiconductors are interposed between electrodes having different work functions.

In 2005, Heeger et al. made an ITO/PEDOT:PSS/P3HT:PCBM blended film/Al-type cell (referred also to as "normal-type solar cell", hereinafter), and achieved a photoelectric conversion efficiency (PCE) of 5% (Non-Patent Literature 1).

The "ITO" as used herein is abbreviation of indium tin oxide.

The "PEDOT:PSS" means a polymer compound comprising poly-3,4-ethylenedioxythiophene (PEDOT) and polystyrene sulfonic acid (PSS), which has the structure below.

[Chemical Formula 1]

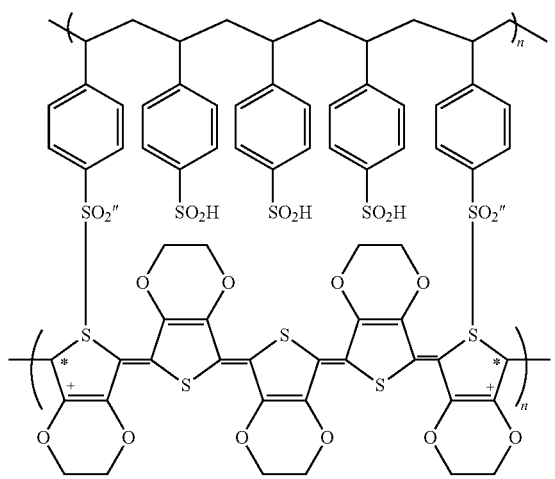

The "P3HT:PCBM blended film" means a film-like body comprising a mixture of poly-3-hexylthiophene (P3HT) and [6,6]-phenyl-$C_{61}$-butyric acid methyl ester (PCBM), and respective constituent substances have the structures below.

[Chemical Formulae 2]

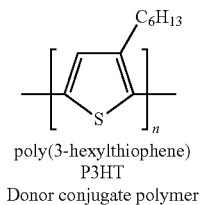

poly(3-hexylthiophene)
P3HT
Donor conjugate polymer

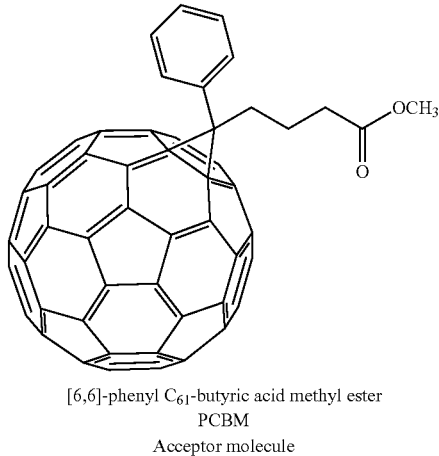

[6,6]-phenyl $C_{61}$-butyric acid methyl ester
PCBM
Acceptor molecule

The currently-reported highest value of photoelectric conversion efficiency in organic thin-film solar cells is 7.4% for a single-type cell, made by Luping Yu et al. in 2010, using a PTB7:$PC_{70}$BM blended film (Non-Patent Literature 2).

In organic thin-film solar cells, it is particularly important for enhancing the performance of a photoelectric conversion element to transport effectively both positive and negative carriers, generated in the organic semiconductor due to light irradiation, to respective electrodes.

For example, in the above normal-type solar cell, a hole transporting layer comprising the PEDOT:PSS is expected to enhance the hole transport efficiency.

In view of enhancing the transport efficiency for electrons, the present inventors have proposed a technique of interposing an oxide semiconductor that functions as a hole blocking layer between an anode electrode and an organic semiconductor layer (e.g., Patent Literature 1).

PRIOR ART LITERATURE

Patent Literature

Patent Literature 1: JP2004-319705A

Non-Patent Literature

Non-Patent Literature 1: Wanli Ma, Cuiying Yang, Xiong Gong, Kwaghee Lee, Alan J. Heeger, Adv. Funct. Mater. 15, 1617-1622 (2005)

Non-Patent Literature 2: Yongye Liang, Zheng Xu, Jiangbin Xia, Szu-Ting Tsai, Yue Wu, Gang Li, Claire Ray, Luping Yu, Adv. Mater., 2010, 22, E135-E138

SUMMARY OF THE INVENTION

Problems to be Solved by the Invention

As described above, it may be possible to interpose an interlayer for enhancing the carrier transport efficiency between an electrode and an organic semiconductor thereby to also enhance the characteristics of an organic thin-film solar cell-type photoelectric conversion element. For the composition and the structure of the interlayer, however, further improvements are desired.

To ensure advantages over photoelectric conversion elements having other structures, it may be insufficient to merely enhance the photoelectric conversion efficiency, and an element will be required which has high productivity and quality stability while having enhanced photoelectric conversion efficiency. However, the development of organic thin-film solar cell-type photoelectric conversion elements still focuses only on enhancing the photoelectric conversion efficiency, and technical developments in view of production technique may not be regarded as importance.

A photoelectric conversion element using an organic semiconductor may be such that the layer comprising the organic semiconductor has flexibility, and hence, one of ultimate goals in the technique associated with the photoelectric conversion element using such a flexible organic semiconductor is to form a flexible photoelectric conversion device using a resin-based material also having flexibility as the material for a substrate that holds the photoelectric conversion element. Actually, however, it may not be easy to realize a flexible photoelectric conversion device because such a resin-based material as the material for the substrate may have to require significantly severe temperature restriction in the production process.

In view of such circumstances, problems to be solved by the present invention include providing a hole blocking layer that is applicable even to a case where the substrate comprises a resin-based material while having excellent basic characteristics, such as high photoelectric conversion efficiency, and a production method of the same, and also providing a photoelectric conversion device that comprises a photoelectric conversion element having that hole blocking layer.

Means for Solving the Problems

The present invention provided for solving the above problems is as follows.

(1) A production method of a hole blocking layer, the hole blocking layer disposed between an organic semiconductor layer and an electrode connected electrically with the organic semiconductor in a photoelectric conversion element, the photoelectric conversion element comprising the organic semiconductor layer and the electrode, the hole blocking layer suppressing electrical conduction between the organic semiconductor layer and the electrode from being carried by holes, the production method comprising: a liquid layer forming step that causes a liquid composition and a surface of a member on which the hole blocking layer is to be formed, to contact with each other thereby forming a liquid layer comprising the liquid composition on the surface of the member on which the hole blocking layer is to be formed, the liquid composition containing a zinc source comprising bis(acetylacetonato)zinc, a complexing agent comprising acetylacetone, and a polar solvent; and a drying step that heats the liquid layer formed by the liquid layer forming step to vaporize the complexing agent and the polar solvent from the liquid layer thereby forming a hole blocking layer comprising zinc oxide on the surface of the member on which the hole blocking layer is to be formed.

(2) The production method of a hole blocking layer according to the above (1), wherein the polar solvent comprises alcohol.

(3) The production method of a hole blocking layer according to the above (1) or (2), wherein boiling point $T_{b1}$ at 1 atm of the polar solvent is 120° C. or higher and 160° C. or lower.

(4) The production method of a hole blocking layer according to either one of the above (1) to (3), wherein the member on which the hole blocking layer is to be formed comprises a resin-based member configured of a resin-based material having a glass-transition temperature, the glass-transition temperature being a temperature higher than a heating temperature applied to the liquid layer in the drying step.

(5) The production method of a hole blocking layer according to the above (4), wherein the resin-based member comprises polyethylene terephthalate.

(6) The production method of a hole blocking layer according to either one of the above (1) to (5), wherein the drying step uses a heating temperature of 100° C. or lower.

(7) A hole blocking layer disposed between an organic semiconductor layer and an electrode connected electrically with the organic semiconductor in a photoelectric conversion element, the photoelectric conversion element comprising the organic semiconductor layer and the electrode, the hole blocking layer suppressing electrical conduction between the organic semiconductor layer and the electrode from being carried by holes, wherein the hole blocking layer is produced by the production method according to either one of the above (1) to (6).

(8) The hole blocking layer according to the above (7), wherein the hole blocking layer has a thickness of 5 nm or more and 200 nm or less.

(9) The hole blocking layer according to the above (8), wherein the hole blocking layer has a surface roughness of 5 nm or less as Ra.

(10) A photoelectric conversion element comprising a laminate in which a first collector electrode layer, the hole blocking layer according to either one of the above (7) to (9), an organic semiconductor layer and a second collector electrode layer are disposed in this order.

(11) The photoelectric conversion element according to the above (10), wherein the first collector electrode layer has light transmissivity.

(12) The photoelectric conversion element according to the above (10) or (11), comprising a hole transporting layer between the organic semiconductor layer and the second collector electrode layer, the hole transporting layer facilitating charge transfer between the organic semiconductor layer and the second collector electrode layer to be carried by holes.

(13) A photoelectric conversion device comprising: a photoelectric conversion element according to either one of the above (10) to (12); and a light transmissive substrate disposed to contact with the first or second collector electrode layer of the photoelectric conversion element.

(14) The photoelectric conversion device according to the above (13), wherein the substrate comprises a resin-based member configured of a resin-based material and is disposed to contact with the first collector electrode layer of the photoelectric conversion element.

(15) The photoelectric conversion device according to the above (14), wherein the resin-based member comprises polyethylene terephthalate.

(16) An organic thin-film solar cell panel comprising: the photoelectric conversion device according to either one of the above (13) to (15); and a housing enclosing the photoelectric conversion device.

A light-emitting device comprising the photoelectric conversion device according to either one of the above (13) to (15), wherein the photoelectric conversion element possessed by the photoelectric conversion device comprises a light-emitting element.

Advantageous Effect of the Invention

The hole blocking layer according to the present invention has excellent hole blocking ability and also has light transmissivity. In addition, even if the material of a member on which the hole blocking layer is to be formed is a material, such as polyethylene terephthalate, which has a relatively low glass-transition point, a hole blocking layer having uniform film thickness can be readily obtained. This allows the hole blocking layer to stably function, and the photoelectric conversion element comprising the hole blocking layer according to the present invention therefore has stable photoelectric conversion performance.

Moreover, the photoelectric conversion element according to the present invention can be formed on a substrate that comprises a resin-based member, and a photoelectric conversion device configured in such a manner has enhanced flexibility.

Furthermore, the production method of a hole blocking layer according to the present invention needs not special atmosphere control, and can increase the area per batch and perform continuous production, thus having enhanced productivity.

EMBODIMENTS FOR CARRYING OUT THE INVENTION

Figure 1:
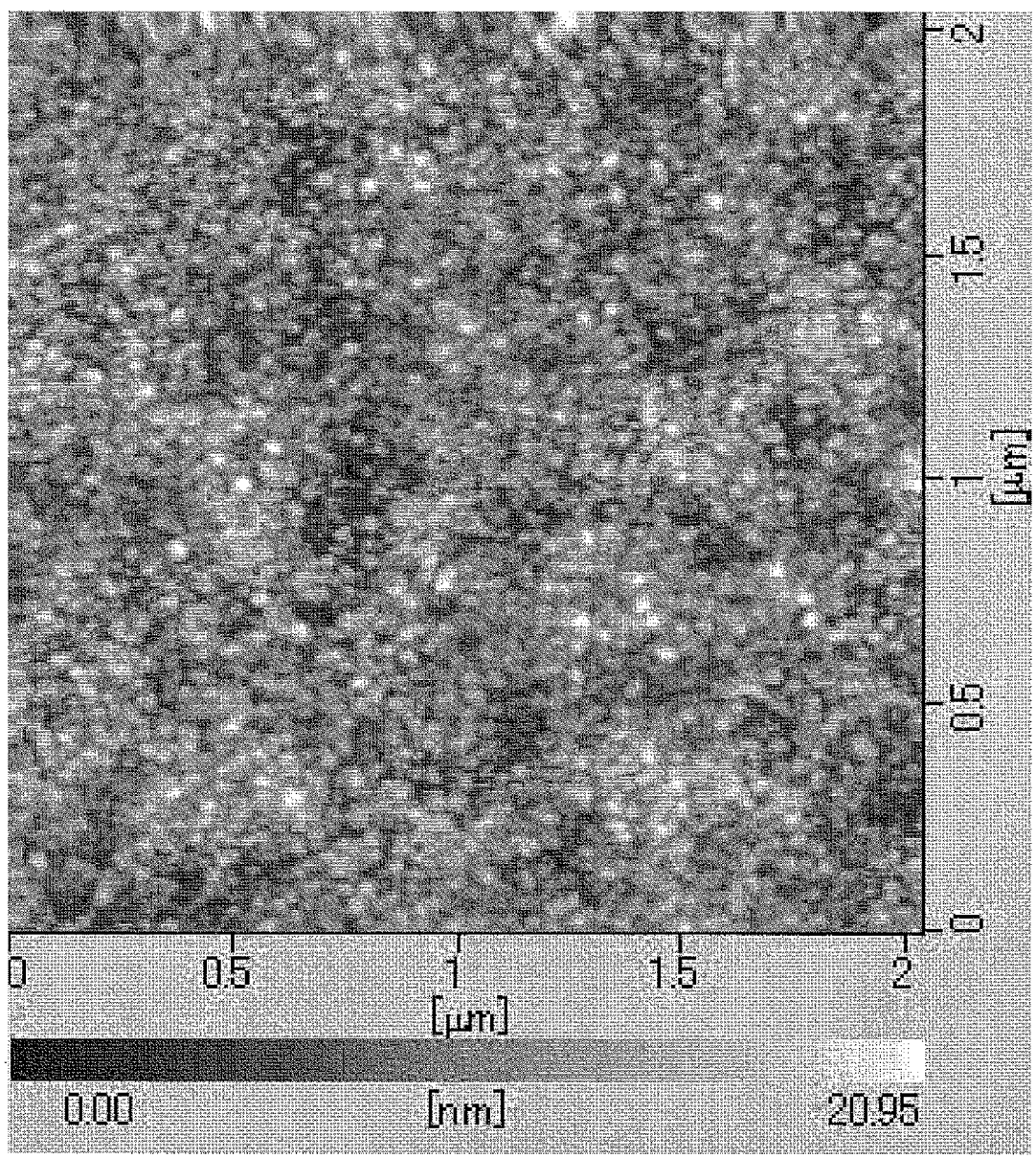
FIG. 1 is an image showing an SPM measurement result of a zinc oxide-formed substrate according to Example 1.

The hole blocking layer according to the present invention and an element and a device that comprise the hole blocking layer will hereinafter be described in detail.
1. Hole Blocking Layer In the present invention, the hole blocking layer refers to one that is disposed between an organic semiconductor layer and an electrode connected electrically with the organic semiconductor layer in an element, which comprises the organic semiconductor layer and the electrode, to suppress electrical conduction between the organic semiconductor layer and the electrode from being carried by holes, and the characteristic of suppressing the passage of holes due to the hole blocking layer is referred to as hole blocking ability.

The hole blocking layer according to the present invention comprises zinc oxide, and may consist substantially of zinc oxide in preferable embodiments. The hole blocking layer comprising zinc oxide according to the present invention will hereinafter be referred to as "zinc oxide layer". The term "substantially" as used herein means that the hole blocking layer according to the present invention may inevitably contain a slight amount of impurities, such as comprised of solvent components, other than the zinc oxide for the reasons in production.

The zinc oxide layer according to the present invention has excellent hole blocking ability, and the charge transport thus takes place preferentially via electrons between the organic semiconductor layer and the electrode which are disposed so as to sandwich the zinc oxide layer therebetween, so that holes are efficiently suppressed from moving between the organic semiconductor layer and the electrode. This realizes that, if the photoelectric conversion element comprising the hole blocking layer is a solar cell, then electrons generated in the organic semiconductor layer due to irradiation of light can efficiently reach the electrode. If, on the other hand, the photoelectric conversion element is a light-emitting element such as an organic EL element, then it is realized that electrons injected from an electron-injection electrode can be injected efficiently into the organic semiconductor layer that forms a light-emitting layer. Therefore, the photoelectric conversion element comprising such a zinc oxide layer has high photoelectric conversion efficiency both in cases of light irradiation and charge injection.

The case where the photoelectric conversion element is an organic thin-film solar cell will later be described in detail, so the description will now be directed to the case where the photoelectric conversion element is an organic EL element.

The organic EL element has a basic structure in which an organic light-emitting layer (i.e., organic semiconductor layer) that comprises an organic semiconductor is interposed between an electron-injection electrode and a hole-injection electrode. If a certain voltage is applied between both ends of this element, then electrons are injected into the organic light-emitting layer from the electron-injection electrode, while holes are injected into the organic light-emitting layer from the hole-injection electrode. This causes the injected electrons and holes to recombine in the organic light-emitting layer and thereby light-emitting phenomenon takes place.

If herein the hole injection from the hole-injection electrode predominates over the electron injection from the electron-injection electrode to the organic light-emitting layer, then holes preferentially pass through the organic light-emitting layer thereby to contribute in large part to the current flow. This may cause a situation where light-emission does not take place, or the light-emission efficiency is considerably low.

To overcome the above, the zinc oxide layer according to the present invention is inserted between the electron-injection electrode (electrode) and the organic light-emitting layer (organic semiconductor layer) thereby blocking holes to pass through the zinc oxide layer and facilitating the electron injection from the electron-injection layer into the organic light-emitting layer. In addition, holes are accumulated at the side of the organic light-emitting layer with respect to the interface between the zinc oxide layer and the organic light-emitting layer. This increases the probability that the injected electrons from the electron-injection electrode into the zinc oxide layer and the blocked holes recombine in the vicinity of the interface. As a result, the light-emitting efficiency is expected to be enhanced.

As described above, it can be achieved that the zinc oxide layer according to the present invention is used thereby to enhance the function of an organic EL element.

The zinc oxide layer according to the present invention has excellent light transmissivity. Therefore, even when disposed between the electrode, which is provided on the side of a light-irradiation surface or a light-emission surface, and the organic semiconductor layer, the zinc oxide layer is unlikely to inhibit the photoelectric conversion reaction in the organic semiconductor layer. Also from this viewpoint, the photoelectric conversion element comprising the hole blocking layer according to the present invention has enhanced light conversion efficiency.

Note that the zinc oxide layer may contain other materials so long as the hole blocking ability as the hole blocking layer is provided predominantly by the zinc oxide. For example, one or more dopants may be contained to enhance the electron transport efficiency.

This zinc oxide layer according to the present invention may be produced by a production method comprising: a liquid layer forming step that causes a liquid composition and a surface of a member on which the hole blocking layer is to be formed (referred hereinafter to as "target member") to contact with each other thereby forming a liquid layer comprising the liquid composition on the surface of the target member, wherein the liquid composition contains a zinc source comprising bis(acetylacetonato)zinc, a complexing agent comprising acetylacetone, and a polar solvent; and a drying step that heats the liquid layer formed by the liquid layer forming step to vaporize the complexing agent and the polar solvent from the liquid layer thereby forming a hole blocking layer comprising zinc oxide on the surface of the target member.

Each step in the above production method will then be described in detail.

(1) Liquid Layer Forming Step

In the liquid layer forming step, the liquid composition, which contains a zinc source comprising bis(acetylacetonato)zinc, a complexing agent comprising acetylacetone and a polar solvent, and the surface of the target member are caused to contact with each other thereby forming a liquid layer comprising the liquid composition on the surface of the target member.

It is preferred that the zinc source contained in the liquid composition contains bis(acetylacetonato)zinc as the main component, and it is also preferred that the zinc source consists of bis(acetylacetonato)zinc. Examples of the zinc source other than bis(acetylacetonato)zinc include zinc acetate, but zinc acetate may be relatively difficult to dissolve in the liquid composition, as will be described later in Examples.

It is preferred that the complexing agent contained in the liquid composition contains acetylacetone as the main component, and it is also preferred that the complexing agent consists of acetylacetone. Examples of the complexing agent other than acetylacetone include ethanolamine, but ethanolamine as the complexing agent may deteriorate the stability of the liquid composition, as will be described later in Examples.

It is preferred that the polar solvent contained in the liquid composition is non-aqueous solvent (solvent substantially free from water), and the polar solvent may be polar protic solvent, such as alcohol, or may also be polar aprotic solvent, such as ketone and ether. From the viewpoint of obtaining a zinc oxide layer excellent in its film thickness uniformity, it is preferred that the polar solvent has an evaporative drying rate near that of acetylacetone as the complexing agent, and it is therefore preferred that the boiling point $T_{b1}$ at 1 atm of the polar solvent (unless otherwise stated, "boiling point" means the boiling point at 1 atm, hereinafter) is near 140° C., which is the boiling point of acetylacetone. More specifically, it is preferred that the $T_{b1}$ is 120° C. or higher and 160° C. or lower.

The polar solvent may preferably be alcohol, and more preferably 2-methoxyethanol (boiling point: 125° C.).

Note that the bis(acetylacetonato)zinc used as the zinc source comprises two acetylacetonato ions which are monovalent anions and one zinc ion which is divalent cation, thus formally being electrically neutral. Therefore, the solubility thereof in polar solvent such as alcohol is predicted to be low. However, as a result of studies by the inventors, it has become apparent that the bis(acetylacetonato)zinc has a high solubility in polar solvent, particularly in a mixed solvent that comprises alcohol and acetylacetone as the complexing agent, and can form stable solution.

It is preferred that the content of the zinc source to the liquid composition is 0.1 mol/L or more and 1.0 mol/L or less in terms of zinc. If the content is unduly low, there is a concern that troubles may occur, such as that the zinc oxide layer will be difficult to be formed, and the time and energy required for removing the mixed solvent will increase. If, on the other hand, the above content is unduly high, there is a concern that excessive time may be required to dissolve the zinc source, thus reducing the productivity, and/or the stability of the liquid composition may deteriorate.

When the mixed solvent comprising a polar solvent and a complexing agent contains alcohol as the polar solvent, the volume ratio of acetylacetone contained in the complexing agent to the mixed solvent (this ratio will also referred to as "AA ratio", hereinafter) is not particularly limited. As the AA ratio increases, the ability of dissolving bis(acetylacetonate)zinc as the zinc source becomes higher, but if the AA ratio is unduly high, there is a concern that acetylacetone remains due to the stabilization of a complex. Therefore, it is practically preferred that the upper limit of the AA ratio is about 20%.

Further, when the mixed solvent comprising a polar solvent and a complexing agent contains alcohol as the polar solvent, it is preferred that the ratio of the molar concentration of acetylacetone to the molar concentration in terms of zinc of bis(acetylacetonate)zinc as the zinc source (this ratio will also referred to as "AA/Zn ratio", hereinafter) is 2 or more. The upper limit of the AA/Zn ratio is not particularly limited. Unduly high AA/Zn ratio may enhance the stability of a precursor (bis-acetylacetonate complex of zinc in a state of being dissolved in the liquid composition) and relatively reduce the content of the zinc source, and hence there is a concern that troubles may occur, such as that the zinc oxide layer will be difficult to be formed, and the time and energy required for removing the mixed solvent will increase. Therefore, it is practically preferred that the upper limit of the AA/Zn ratio is about 4.

The liquid composition may contain other components, but such other components may have not to significantly inhibit the functionality of the zinc oxide layer as the hole blocking layer. Examples of such other components include particle-like dopants, and members for enhancing the light transmissivity (e.g., fumed silica).

The method of causing the liquid composition and the surface of the target member to contact with each other may be freely selected. The target member may be immersed in the liquid composition, or the liquid composition may be applied to the surface of the target member using a spray or roll. In an alternative embodiment, an ink-jet apparatus may be used for discharging liquid drops of the liquid composition to form a liquid layer on the surface of the target member.

The temperature of the liquid composition when the liquid layer is formed is freely selected, provided that the uniformity of the thickness of the liquid layer is not significantly deteriorated. The formation of the liquid layer may practically be performed under room temperature, and if heating is employed, the upper limit may preferably be about 50° C.

(2) Drying Step

In the drying step, the liquid layer formed by the liquid layer forming step is heated to vaporize the complexing agent and the polar solvent from the liquid layer thereby forming the zinc oxide layer on the surface of the target member.

The drying means, drying temperature and drying time may appropriately be set on the basis of known techniques so that the components such as the solvent and the complexing agent are vaporized. The liquid composition according to one embodiment of the present invention is such that the boiling points of the contained solvent and complexing agent are relatively low, and hence even if the drying temperature is about 100° C., it can be achieved to obtain a zinc oxide layer having excellent uniformity in its film thickness. That is to say, the production method of a hole blocking layer according to the present invention is, in one aspect, a production method of a hole blocking layer which accepts the use of low-temperature process.

When the target member comprises a resin-based member, in particular where the target member is configured of a polyethylene terephthalate (PET) sheet formed thereon with an ITO electrode pattern, the drying temperature being about 100° C. as the above may not deform the PET sheet during the drying step with such an extent that considerably deteriorates the flatness because the PET sheet has a glass-transition point of about 110° C. Therefore, a member obtained from the target member provided thereon with the zinc oxide layer can be favorably used as a constitutional member of a photoelectric conversion device.

The thickness of the zinc oxide layer may appropriately be set depending on the characteristics required for an element that comprises the zinc oxide layer. As an example, if the element is a photoelectric conversion element, such characteristics may be the balance between the hole blocking ability and the light transmissivity, and the productivity. One preferable example of the thickness of the zinc oxide layer may be within a range of 5 to 200 nm. More preferably, the thickness of the zinc oxide layer may range from 10 to 100 nm, and most preferably from 10 to 50 nm.

2. Photoelectric Conversion Element

The photoelectric conversion element according to the present invention is, as one preferable aspect, a laminate in which a first collector electrode layer, a hole blocking layer, an organic semiconductor layer, a hole transporting layer and a second collector electrode layer are disposed in this order, and at least one of the first collector electrode layer and the second collector electrode layer has light transmissivity.

Describing in detail one specific embodiment of the above photoelectric conversion element according to the present invention, the photoelectric conversion element according to one embodiment of the present invention comprises: a thin-film-like first collector electrode layer; a hole blocking layer provided on the surface of the first collector electrode layer and comprising a zinc oxide layer; an organic semiconductor layer provided on the opposite surface of the hole blocking layer to the surface in contact with the first collector electrode layer; a hole transporting layer provided on the opposite surface of the organic semiconductor layer to the surface in contact with the hole blocking layer; and a thin-film-like second collector electrode layer provided on the opposite surface of the hole transporting layer to the surface in contact with the organic semiconductor layer, wherein at least one of the first collector electrode layer and the second collector electrode layer has light transmissivity.

As an example where the photoelectric conversion element is an organic thin-film semiconductor, each layer will be described in detail below.

(1) First Collector Electrode Layer

The first collector electrode layer according to the present invention comprises an organic, inorganic, or metallic conductive material, and at least one of the first collector electrode layer and the second collector electrode layer as will be described later has light transmissivity. Description will hereinafter be made for an example where the first collector electrode layer is a light transmissive electrode layer that has light transmissivity while the second collector electrode layer comprises a metal that does not have light transmissivity.

It is preferred that the light transmissive electrode layer according to the present invention is a layer that has high light transmissivity to be capable of efficiently supplying light irradiated onto the photoelectric conversion element to the organic semiconductor layer. It is also preferred that the layer has high electric conductivity so as to be capable of efficiently extracting the electric energy generated in the organic semiconductor layer.

Examples of material for the light transmissive electrode layer include conductive metal oxides such as ITO and FTO (Fluorine-doped Tin Oxide), and organic transparent conductive substances such as PEDOT:PSS. In an alternative embodiment, a layer comprising a metal thin film may be caused to have light transmissivity. Examples of such a metal thin film include gold film, silver film and aluminum film having a thickness of 10 nm or less, preferably a thickness of about 5 nm.

The thickness of the light transmissive electrode layer may appropriately be set in consideration of the light transmissivity and electric conductivity of the constituent materials. The thickness may preferably be within a range of about 1 to 10,000 nm, and more preferably about 10 to 300 nm.

(2) Hole Blocking Layer

A hole blocking layer comprising the zinc oxide layer according to the present invention may be applicable. Such a hole blocking layer has excellent characteristics as previously described.

The thickness of the zinc oxide layer may appropriately be set in consideration of the balance between the hole blocking ability and the light transmissivity, and the productivity. As a basic tendency, a thicker zinc oxide layer allows higher hole blocking ability, but reduces the light transmissivity. To increase the thickness of the zinc oxide layer, it is required to increase the thickness of the liquid film comprising the liquid composition, and if the liquid film is unduly thick, there is a concern that the productivity deteriorates. The photoelectric conversion efficiency may substantially be constant if the thickness of the zinc oxide layer is within a range of 5 to 200 nm. Therefore, it is preferred that the thickness of the zinc oxide layer ranges from 5 to 200 nm. The thickness of the zinc oxide layer may more preferably range from 10 to 100 nm, and most preferably from 10 to 50 nm.

(3) Organic Semiconductor Layer

In the present invention, the "organic semiconductor layer" refers to a film-like body that comprises an organic substance having properties as a semiconductor such that the properties of the layer as a semiconductor are derived mainly from the organic substance.

In particular, the organic semiconductor layer used as one element of the photoelectric conversion element may have to have a bandgap to such an extent that a charge separation state is generated due to light irradiation, and may also have to have mobilities to such an extent that the positive and negative charges generated due to light irradiation can continuously move toward the first and second collector electrode layers, respectively.

Examples of a material, in particular a low molecular-weight material, that constitutes such an organic semiconductor layer include: in addition to pentacene, phthalocyanine derivatives; naphthalocyanine derivatives; azo compound derivatives; perylene derivatives; indigo derivatives; quinacridone derivatives; polycyclic quinone derivatives, such as anthraquinone; cyanine derivatives; fullerenes derivatives; nitrogen-containing cyclic compound derivatives, such as indole, carbazole, oxazole, isoxazole, thiazole, imidazole, pyrazole, oxadiazole, pyrazoline and triazole; hydrazine derivatives; triphenylarnine derivatives; triphenylmethane derivatives; stilbenes; quinone compound derivatives, such as anthraquinone and diphenoxyquinone; porphyrin derivatives; and polycyclic aromatic compound derivatives, such as anthracene, pyrene, phenanthrene and coronene. Examples of a polymer material include: aromatic conjugate polymers, such as polyparaphenylene; aliphatic conjugate polymers, such as polyacetylene; heterocyclic conjugate polymers, such as polypyrrole and polythiophene; heteroatom-containing conjugate polymers, such as polyanilines and polyphenylene sulfide; complex-type conjugate polymers, such as poly(phenylenevinylene), poly(arylenevinylene) and poly(thienylenevinylene), which have a structure in which constitutional units of the conjugate polymers are alternately bonded; and other carbon-based conjugate polymers. Such examples further include: polysilanes; and polymers, such as disilanylenearylene polymers, (disilanylene)ethenylene polymers, (disilanylene)ethynylene polymers and other disilanylene carbon-based conjugate polymer structures, in which oligosilanes and carbon-based conjugate structures are alternately linked. Polymer chains comprising inorganic elements, such as phosphorus-based and nitrogen-based ones, may also be used, and such other examples include: polymers, such as phthalocyanate polysiloxane, in which aromatic ligands of a polymer chain are coordinated; polymers in which perylenes, such as perylenetetracarboxylic acid, are ring-concentrated by means of heat treatment; ladder-type polymers obtained through heat treatment of polyethylene derivatives that have cyano groups, such as polyacrylonitrile; and complex materials in which organic compounds are intercalated into perovskites.

The organic semiconductor layer may be configured of a single organic material, or may also be configured of plural organic materials. If configured of plural organic materials, it may have a laminate structure, or may also be a mixture. Examples of such structures include a structure in which a self-assembled film (SAM: Self-Assembled Monolayer), e.g., a fullerene derivative, is formed at the interface with the hole blocking layer in the organic semiconductor layer, while other portions of the organic semiconductor comprise a mixture of plural organic semiconductors, e.g., the previously-described mixture of P3HT and PCBM.

The organic semiconductor layer according to the present invention may contain other materials than the organic material, e.g., inorganic materials, but the semiconductor characteristics possessed by the organic semiconductor layer should be derived mainly from the organic material.

In view of enhancing the functionality as a photoelectric conversion element, it is preferred that the organic semiconductor layer according to the present invention comprises a conjugate polymer as the electron donor and a fullerene derivative as the electron acceptor. That is, one preferable aspect of the photoelectric conversion element according to the present invention belongs to so-called bulk heterojunction-type organic thin-film solar cells.

Specific examples of the conjugate polymer as the electron donor include, in addition to the above P3HT and PCPDTBT (poly[2,6-(4,4-bis(2-ethyl-hexyl)-4H-cyclopenta[2,1-b:3,4-b']dithiophene)-alt-4,7-(2,1,3-benzothiadiazole)]), PA-PPV (poly(phenylimino-1,4-phenylene-1,2-ethynylene-2,5-dihexyloxy-1,4-phenylene-1,2-ethynylene-1,4-phenylene)) and PTB (poly(thieno[3,4-b]thiophene)-benzodithiophene) derivatives.

Specific examples of a fullerene derivative as the electron acceptor include, in addition to the above PCBM and $PC_{70}BM$, bis[60]PCBM expressed by the formula below, bis[70]PCBM, and ICBA (indene-C60 bisadduct).

[Chemical Formula 3]

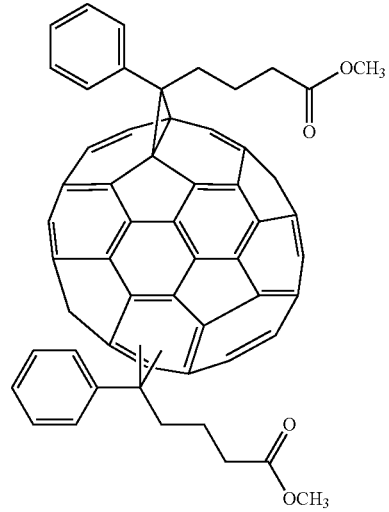

The above organic semiconductor layer may be formed only of two components, i.e., a conjugate polymer and a fullerene derivative, but may also be further added thereto with appropriate materials, such as conductive material having photoelectric conversion effect and colorant, as necessary.

Examples of the conductive material include polyacetylene-based, polypyrrole-based, polythiophene-based, polyparaphenylene-based, polyparaphenylenevinylene-based, polythienylenevinylene-based, poly(3,4-ethylenedioxythiophene)-based, polyfluorene-based, polyaniline-based, and polyacene-based conductive materials (except PEDOT:PSS).

Examples of the colorant include cyanine-based, merocyanine-based, phthalocyanine-based, naphthalocyanine-based, azo-based, quinone-based, quinoneimine-based, quinacridone-based, squarylium-based, triphenylmethane-based, xanthene-based, porphyrin-based, perylene-based, and indigo-based colorants.

When the organic semiconductor layer is configured of two components, i.e., the conjugate polymer and the fullerene derivative, the compounding ratio of the two components is not particularly limited. When using P3HT as the conjugate polymer and PCBM as the fullerene derivative, the ratio P3HT:PCBM (mass ratio) may preferably be within a range of about 5:3 to 5:6, and more preferably about 5:3 to 5:4.

When other additives (such as conductive material and colorant) are added, the additive amount thereof may be, but not limited to, preferably within a range of 1 to 100 mass parts, and more preferably 1 to 40 mass parts, when the total amount of the conjugate polymer and the fullerene derivative is 100 mass parts.

The method of forming the organic semiconductor layer is not particularly limited. For example, it may be formed by means of spin-coating of a solution that contains the conjugate polymer and the fullerene derivative onto the hole blocking layer of a member that comprises the hole blocking layer. Examples of the solvent in that solution include chlorobenzene, 1,2-dichlorobenzene, and tetralin:1,8-octanedithiol mixed solvent.

When other additives are contained, it is preferred that these additives are preliminarily mixed or dissolved into the above solution.

The thickness of the organic semiconductor layer may be, but not limited to, preferably within a range of about 50 to 400 nm, and more preferably about 200 to 300 nm.

(4) Hole Transporting Layer

The photoelectric conversion element according to the present invention may have a hole transporting layer between the above organic semiconductor layer and second collector electrode layer. The term "hole transporting layer" refers to a layer that has a function of facilitating that the charge transfer between the organic semiconductor layer and the second collector electrode layer is carried by holes, and preferably, suppressing the charge transfer from being carried by electrons. That is, the hole transporting layer has a p-type semiconductor characteristic such that the electrical conduction is carried out by holes.

Having the hole transporting layer between the organic semiconductor layer and the second collector electrode layer allows holes, among the charges generated in the organic semiconductor layer due to light irradiation, to preferentially reach the second collector electrode layer, thus enhancing the photoelectric conversion efficiency.

The material that constitutes the hole transporting layer in the photoelectric conversion element according to the present invention is not particularly limited so long as the material can function as the hole transporting layer. Specific examples thereof include phthalocyanine derivatives, such as copper phthalocyanine; bis(di(p-tolyl)aminophenyl)-1,1-cyclohexane; N,N,N',N'-tetraamino-4,4'-diaminobiphenyl; triphenyl diamines, such as the previously-described NPD; starbust-type molecules, such as tris(4-(N,N-di-m-tolylamino)phenyl)amine; acenes, such as anthracene, tetracene and pentacene; and polyalkylthiophenes, such as the above-described P3HT, poly-3-octylthiophene (P3OT) and poly-3-dodecylthiophene (P3DDT). Such examples further include poly[bis(4-phenyl)(2,4,6-trimethylphenyl)amine] (PTAA), poly[2-methoxy-5-(2-ethylhexyloxy)-1,4-phenylenevinylene] (MEH-PPV), poly[2-methoxy-5-(3',7'-dimethyloctyloxy)-1,4-phenylenevinylene] (MDMO-PPV), poly[9,9-di-n-octylfluorenyl-2,7-diyl]-alt-(benzo[2,1,3]thiadiazole-4,8-diyl)] (F8BT), and poly[9,9-di-n-octylfluorenyl-2,7-diyl]-co-bithiophenyl] (F8T2).

These materials may be solely used, or may also be used in combination, such as in the form of a laminate or a mixture.

Among these materials, PEDOT:PSS, which is a mixture of poly-3,4-ethylenedioxythiophene (PEDOT) and polystyrene sulfonic acid (PSS), may be most commonly used.

It is preferred that the photoelectric conversion element according to the present invention also uses PEDOT:PSS as the hole transporting layer. In particular, the hole transporting layer may preferably be produced by a process having a step that causes the surface of an organic semiconductor of a member, in which a light transmissive electrode layer, a hole blocking layer and the organic semiconductor layer is laminated, and an aqueous solution, which contains PEDOT, PSS and nonionic surfactant, to contact with each other.

The method of forming the hole transporting layer is not particularly limited. For example, the hole transporting layer may be formed by means of spin-coating of an aqueous dispersion liquid, which contains PEDOT and PSS and to which a nonionic surfactant is added, onto an organic semiconductor layer of a member that comprises the organic semiconductor layer. To enhance the wettability of the organic semiconductor layer to the above dispersion liquid, the dispersion liquid may be heated (e.g., at 50° C. to 90° C.).

The thickness of the hole transporting layer may be, but not limited to, preferably within a range of about 20 to 120 nm, and more preferably about 30 to 90 nm.

(5) Second Collector Electrode Layer

The second collector electrode layer according to the present invention comprises an organic, inorganic or metallic conductive material, and at least one of the first collector electrode layer and the second collector electrode layer has light transmissivity.

When the second collector electrode layer according to the present invention comprises a metal that does not have light transmissivity, it is preferred that the second collector electrode layer comprises a gold electrode. The production method therefor is not particularly limited. Any known method, e.g., vacuum vapor deposition method, may be used to perform film forming of gold on the organic semiconductor layer or on the hole transporting layer formed thereon.

If problems may occur such that a vacuum film formation process damages the organic semiconductor layer or damages the hole transporting layer formed thereon, then a metal foil or ITO (specific examples include aluminum foil and film ITO) having a surface on which thin gold or silver is preliminarily vapor-deposited may be contacted with the surface of the organic semiconductor layer or of the hole transporting layer formed thereon.

In cases where the second collector electrode layer is formed by any of these methods, for the purpose of enhancing the electric conductivity between the organic semiconductor layer or the hole transporting layer formed thereon and the second collector electrode layer, it is preferred to heat a region that includes the interface between the organic semiconductor layer or the hole transporting layer formed thereon and the second collector electrode layer at a temperature within a range of about 80° C. to 150° C. for about 5 minutes.

It is also preferred that the whole of a member formed thereon and/or therein with the photoelectric conversion element is subjected to aging treatment at a temperature of about 70° C. for about 1 hour.

When the first and second collector electrode layers according to the present invention have light transmissivity, it may be possible to obtain a structure in which the whole of the photoelectric conversion element has light transmissivity. If such a photoelectric conversion element is applied to a window glass or the like, for example, then electric power generation will be realized while letting in the daylight.

In an alternative embodiment, a tandem-type photoelectric conversion element may be provided by laminating plural photoelectric conversion elements each comprising the first collector electrode layer, the hole blocking layer, the organic semiconductor layer and the second collector electrode layer, and as necessary further comprising the hole transporting layer. In this case, two collector electrode layers that constitute connection parts of the laminated photoelectric conversion elements may be formed integrally with each other. Examples of such a photoelectric conversion element include a photoelectric conversion element configured to have an arrangement such that a first collector electrode layer, a hole blocking layer, an organic semiconductor layer, a collector electrode layer that acts as both a second collector electrode layer and another first collector electrode layer, a hole blocking layer, an organic semiconductor layer, and another second collector electrode layer are laminated in this order.

When a hole transporting layer is added to perform photoelectric conversion on the basis of the difference between the hole mobility in the hole blocking layer and that in the hole transporting layer, it may be possible to obtain a photoelectric conversion element having a laminated structure that comprises a transparent collector electrode layer, a hole blocking layer, an organic semiconductor layer, a hole transporting layer, a transparent collector electrode layer, a hole blocking layer, an organic semiconductor layer, a hole transporting layer, a transparent collector electrode layer, . . . .

3. Photoelectric Conversion Device

A photoelectric conversion device is obtained by disposing a light transmissive substrate on the photoelectric conversion element according to the present invention so that the substrate contacts with at least one of the first and second collector electrode layers of the photoelectric conversion element. This photoelectric conversion device may have one or more wiring patterns for being connected with the electrode or electrodes of the photoelectric conversion element.

When forming the zinc oxide layer to be the hole blocking layer of the photoelectric conversion element according to the present invention as previously described, the heating temperature can be about 100° C. Therefore, if a light transmissive substrate is prepared as a resin-based member comprising a resin-based material, specifically PET, and a first collector electrode layer having light transmissivity is formed on the substrate, and further, a zinc oxide layer is formed, then a photoelectric conversion device can be obtained which has flexibility and comprises the light transmissive substrate disposed to contact with the first collector electrode layer of the photoelectric conversion element according to the present invention.

4. Organic Thin-Film Solar Cell Panel

The organic thin-film solar cell panel according to the present invention comprises: a light transmissive substrate; a photoelectric conversion element according to the present invention provided on the light transmissive substrate so that the electrode layer having light transmissivity contacts with the light transmissive substrate; and a housing that encloses the photoelectric conversion element.

Any known transparent substrate, such as a glass substrate and a resin film, can be used as the light transmissive substrate. In particular, it is preferred to use a resin film or the like because in this case the organic thin-film solar cell panel can have flexibility to be flexibly deformed.

The housing that encloses the photoelectric conversion element according to the present invention is not particularly limited if it is a member that can seal the photoelectric conversion element from external air so that the photoelectric conversion element is interposed between the transparent substrate and the housing. The shape thereof may be, but not limited to, box-like, plate-like or other appropriate shape. From the viewpoint of making thinner a housing-sealed organic thin-film solar cell panel, a flat thin plate-like glass sheet may be preferable. It is preferred to use a resin film having flexibility as the housing because in this case the organic thin-film solar cell panel can have flexibility to be flexibly deformed.

EXAMPLES

The present invention will hereinafter be described specifically with reference to Examples and Comparative Examples. Note, however, that the present invention is not limited to the Examples.

Example 1

(1) Production of Organic Thin-Film Solar Cell

A glass substrate with ITO film (available from Furuuchi Chemical Corporation) was prepared in which an ITO film had been laminated on one surface of a glass substrate (22 mm×38 mm, thickness: 1.1 mm) by means of sputtering. The film thickness was 200 nm, and the sheet resistance of the ITO film as the light transmissive electrode layer was 10Ω/□.

This ITO-covered glass substrate was subjected to ultrasonic cleaning and boil washing in 2-propanol. The substrate obtained in such a manner will hereinafter be referred to as "ITO substrate".

Plural types of liquid compositions 1 to 3 were each prepared to contain 0.35 mol/L of bis(acetylacetonate)zinc as the zinc source, different content of acetylacetone as the complexing agent and 2-methoxyethanol as the polar solvent by stirring a mixture comprising these components in an environment of room temperature and 50% RH. The AA ratios of these liquid compositions 1 to 3 were 3.6% (AA/Zn ratio: 1), 7.2% (AA/Zn ratio: 2) and 10.8% (AA/Zn ratio: 3), respectively.

The liquid composition 2 (AA ratio: 7.2%, AA/Zn ratio: 2) prepared in accordance with the above procedure was dripped with an amount of about 0.3 mL onto the ITO substrate as a target member, and was spin-coated at 1,000 rpm for 1 minute.

The ITO substrate having a surface formed thereon with the liquid layer of the liquid composition 2 was dried for 1 hour on a hot plate set at 100° C. to volatilize the solvent and the like.

An ITO substrate was thus obtained in which the zinc oxide layer to be the hole blocking layer having a thickness of 100 nm was formed on the ITO. This substrate will hereinafter be referred to as "zinc oxide layer-formed substrate".

A chlorobenzene solution was prepared to contain 3.9 mass % of a mixture of P3HT (polythiophene derivative, available from Aldrich) and a fullerene derivative bis[60] PCBM (available from Solenne) with a mass ratio of 5:4.

The above chlorobenzene solution was spin-coated (1,500 rpm, 60 s) onto the zinc oxide layer and dried at room temperature for about 30 minutes to form an organic semiconductor layer having a thickness of 250 nm.

A nonionic surfactant (available from Aldrich) was prepared in which 1 mass % of polyoxyethylene tridecyl ether (PTE, $C_{13}H_{27}(OCH_2CH_2)_nOH$, n=6) and 1 mass % or xylene had been contained with water and isopropanol as solvents, and 0.5 mass parts of this nonionic surfactant were mixed with 100 mass parts of a 1.3 mass % PEDOT:PSS aqueous dispersion (available from Aldrich) to prepare a PTE-containing PEDOT:PSS aqueous dispersion liquid.

The above PTE-containing PEDOT:PSS aqueous dispersion liquid was heated at 50° C. to 90° C. and spin-coated (6,000 rpm, 60 s) onto the organic semiconductor layer, followed by natural drying at room temperature, to form a hole transporting layer having a thickness of 80 nm.

Subsequently, the hole transporting layer was subjected to vacuum vapor deposition such that an Au electrode layer (collector electrode layer) would be formed to have an film thickness of about 100 nm on the hole transporting layer. More specifically, a shadow mask corresponding to the electrode shape of 4 mm×25 mm, and the glass substrate formed thereon with up to the hole transporting layer, were placed in a chamber, and the internal pressure of the chamber was reduced using a rotary pump and a turbo-molecular pump thereby to be $2 \times 10^{-3}$ Pa or less. A gold wire was resistively heated in the chamber to form 100 nm of gold on the hole transporting layer via the shadow mask. The film formation rate was set 10 to 15 nm/min, and the pressure during film formation was $1 \times 10^{-2}$ Pa or less.

Thereafter, the glass substrate having one surface formed thereon with the ITO film (light transmissive electrode layer), the hole blocking layer, the organic semiconductor layer, the hole transporting layer and the gold film as the collector electrode layer in accordance with the above production method was subjected to heat treatment at 150° C. for 5 minutes, and further maintained at 70° C. for 1 hour.

Through the above steps, an organic thin-film solar cell panel was produced to have a photoelectric conversion area of 4 mm×25 mm, i.e., 1.0 cm².

(2) Evaluations
(i) Liquid Property

Checks were performed as to the degree of dissolution of the zinc source during the process of preparing the liquid composition, and as to the property change after the obtained liquid composition had been maintained in a stationary state in an environment of room temperature and 50% RH.

(ii) Surface Property

The surface property of the zinc oxide layer-formed substrate produced using the liquid composition 2 was evaluated using a scanning probe microscope (SPM). Details of evaluation method were as below:
apparatus: atomic force microscope SPI-400 available from SII Nanotechnology Inc;
observation mode: tapping mode (DFM);
measurement area: 2 μm×2 μm or 10 μm×10 μm;
measurement items: Ra and RMS; and
other measurement condition: cantilever spring constant (k) of 40 N/m.

(iii) Current-Voltage Characteristic

The organic thin-film solar cell panel produced in accordance with the above production method was evaluated as below in an unsealed state in the atmosphere.

A solar simulator (XES-502S available from SAN-El Electric) was used to irradiate simulated sunlight, having an AM1.5G spectral distribution and a light intensity of 100 mW/cm², to the organic thin-film solar cell panel from the side of the ITO electrode layer. In this state, the photocurrent-voltage profile of the organic thin-film solar cell was measured using a linear sweep voltammetry (LSV) measurement apparatus (HZ-5000 available from Hokuto Denko).

From this profile, the short-circuit current (absolute value, $J_{sc}$/mA·cm$^{-2}$), open voltage ($V_{oc}$/V), fill factor (FF) and energy conversion efficiency (PCE/%) were calculated.

(3) Evaluation Results
(i) Liquid Property

With regard to the liquid composition 1, the mixture comprising respective components was a clouded liquid, but this liquid was stirred overnight thereby to be a transparent liquid. There was confirmed, however, small needle crystals were suspended in the liquid. This state of the liquid composition 1 (transparent liquid, presence of small suspended substances) did not change even when the liquid composition 1 was maintained stationarily in an environment of room temperature and 50% RH after being stirred.

With regard to the liquid compositions 2 and 3, the mixtures comprising respective components were clouded liquids, but these liquids were stirred overnight thereby to be transparent liquids, and there was not confirmed any small needle crystal suspended in these liquids unlike in the case of the liquid composition 1. This state of the liquid compositions 2 and 3 (transparent liquid, absence of suspended substances) did not change even when the liquid compositions 2 and 3 were maintained stationarily in an environment of room temperature and 50% RH after being stirred.

(ii) Surface Property

The zinc oxide-formed substrate produced using the liquid composition 2 was subjected to measurement using an SPM to obtain an image, which is shown in FIG. 1. Microparticles having a height of about 20 nm or less were densely bedded, and the surface roughness parameters obtained from the measurement result was such that Ra was 1.73 nm and RMS was 2.20 nm.

(iii) Current-Voltage Characteristic

Figure 2:
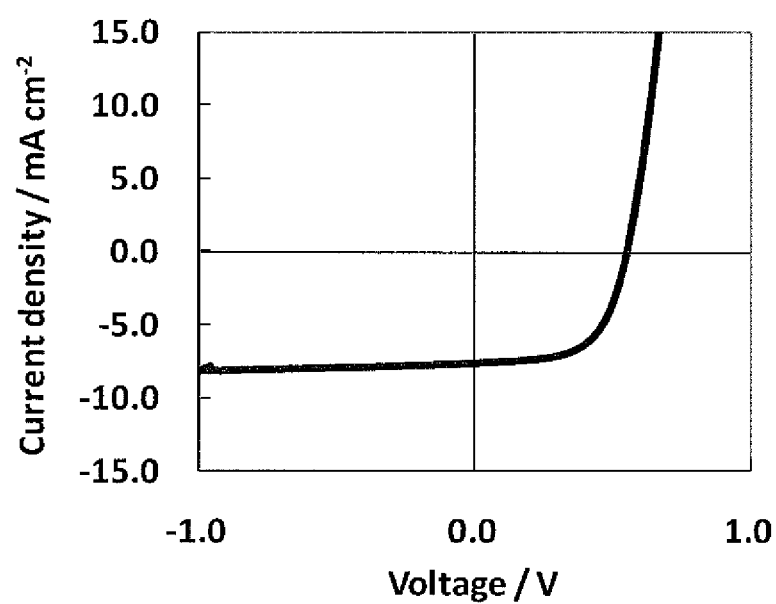
FIG. 2 is a graph showing an evaluation result of current-voltage characteristic of a solar cell panel according to Example 1.

The photocurrent-voltage profile of the organic thin-film solar cell is shown in FIG. 2. In addition, various parameters obtained on the basis of this profile are shown in Table 1.

TABLE 1

| | Liquid composition | Substrate | $J_{sc}$/ mA·cm$^{-2}$ | $V_{oc}$/V | FF | PCE/% |
|---|---|---|---|---|---|---|
| Example 1 | Liquid composition 2 | ITO substrate | 7.59 | 0.55 | 0.60 | 2.51 |
| Example 2 | | PET substrate | 7.16 | 0.54 | 0.48 | 1.82 |
| Comparative Example 3 | Liquid composition 6 | ITO substrate | 6.72 | 0.55 | 0.44 | 1.62 |

Example 2

A zinc oxide-formed substrate and an organic thin-film solar cell panel were obtained using the liquid composition 2 in accordance with the same production method in Example 1 except for substituting the ITO substrate in Example 1 by a member having an electrode pattern of ITO formed on a polyethylene terephthalate (PET) film (available from Reiko Co., Ltd., 22 mm×38 mm, thickness: 0.1 mm, 40Ω/□, referred also to as "PET substrate" hereinafter).

These substrate and panel were subjected to evaluations of the surface property and the current-voltage characteristic like in Example 1.

Figure 3:
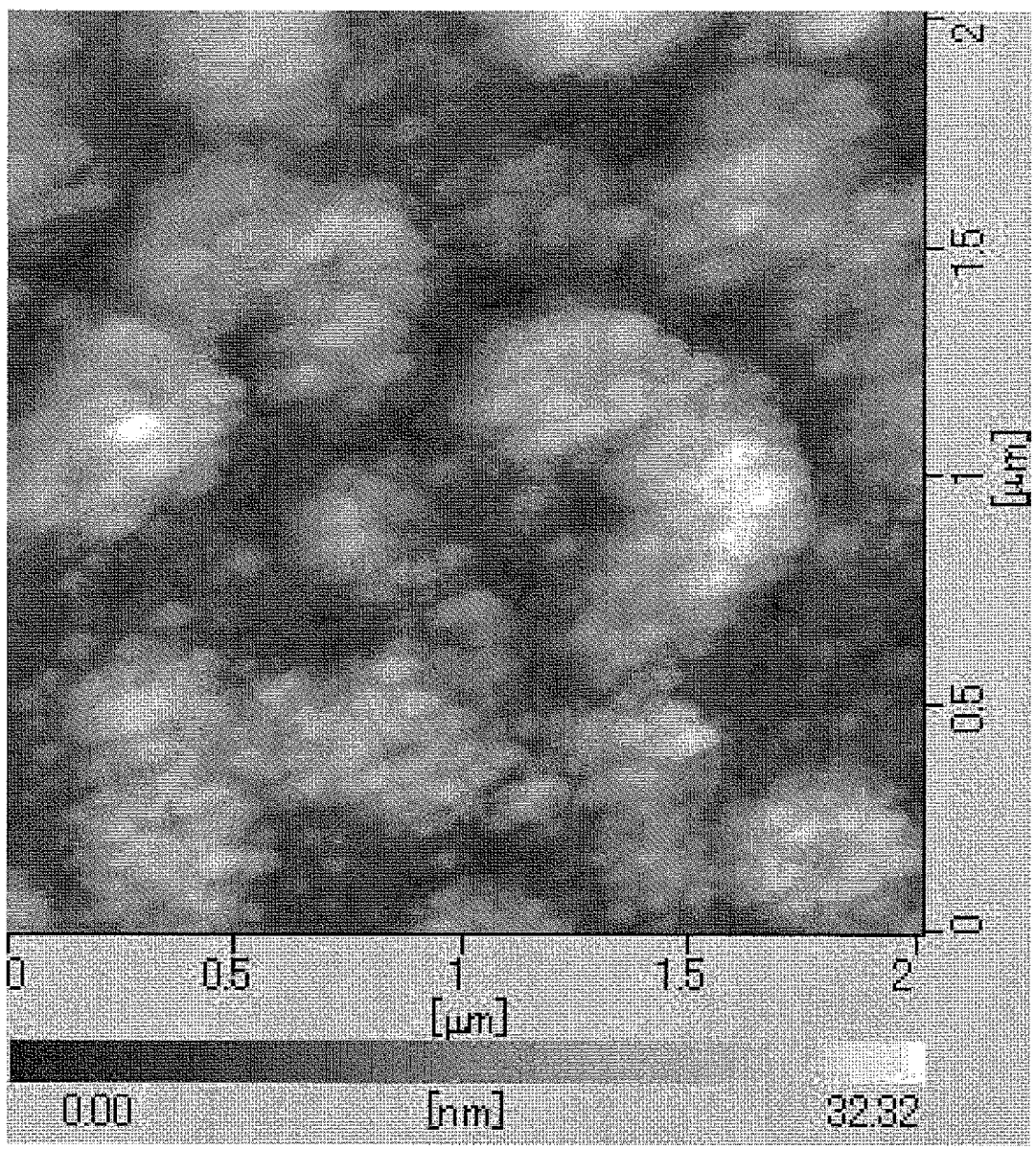
FIG. 3 is an image showing an SPM measurement result of a zinc oxide-formed substrate according to Example 2.

The zinc oxide-formed substrate was subjected to measurement using an SPM to obtain an image, which is shown in FIG. 3. Like in Example 1, microparticles having a height of about less than 20 to 40 nm were densely bedded, and the surface roughness parameters obtained from the measurement result was such that Ra was 4.86 nm and RMS was 5.87 nm.

Figure 4:
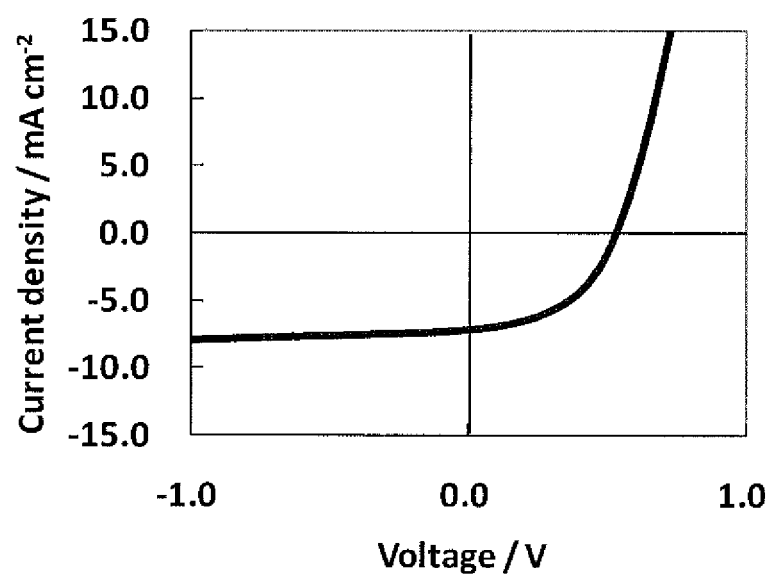
FIG. 4 is a graph showing an evaluation result of current-voltage characteristic of a solar cell panel according to Example 2.

In addition, a photocurrent-voltage profile of the organic thin-film solar cell was obtained as shown in FIG. 4. Various parameters obtained on the basis of this photocurrent-voltage profile are shown in Table 1.

Comparative Example 1

A liquid composition 4 was prepared in the same formulation as the liquid composition 2 except for omitting acetylacetone as the complexing agent (bis(acetylacetonate) zinc as the zinc source was 0.35 mol/L).

The obtained liquid composition 4 was subjected to evaluation of the liquid property like in Example 1.

As a result, the bis(acetylacetonate)zinc was scarcely dissolved even after stirring overnight.

Comparative Example 2

A liquid composition 5 was prepared to contain 0.35 mol/L of zinc acetate as the zinc source, acetylacetone as the complexing agent having an AA ratio of 11 vol %, and 2-methoxyethanol as the polar solvent.

The obtained liquid composition 5 was subjected to evaluation of the liquid property performed in Example 1.

As a result, the zinc source was dissolved after stirring overnight, but clouded within 15 minutes when stationarily maintained, and some precipitation was generated.

Comparative Example 3

A liquid composition 6 was prepared to contain 0.35 mol/L of zinc acetate as the zinc source, ethanolamine as the complexing agent and 2-methoxyethanol as the polar solvent so that the ratio of the complexing agent to the mixed solvent of the complexing agent and the polar solvent was 4 vol %.

A zinc oxide-formed substrate and an organic thin-film solar cell panel were obtained in accordance with the same production method as that for Example 1 except for using the liquid composition 6 as substitute for the liquid composition 2 in Example 1.

These substrate and panel were subjected to evaluations of the surface property and the current-voltage characteristic performed in Example 1.

Figure 5:
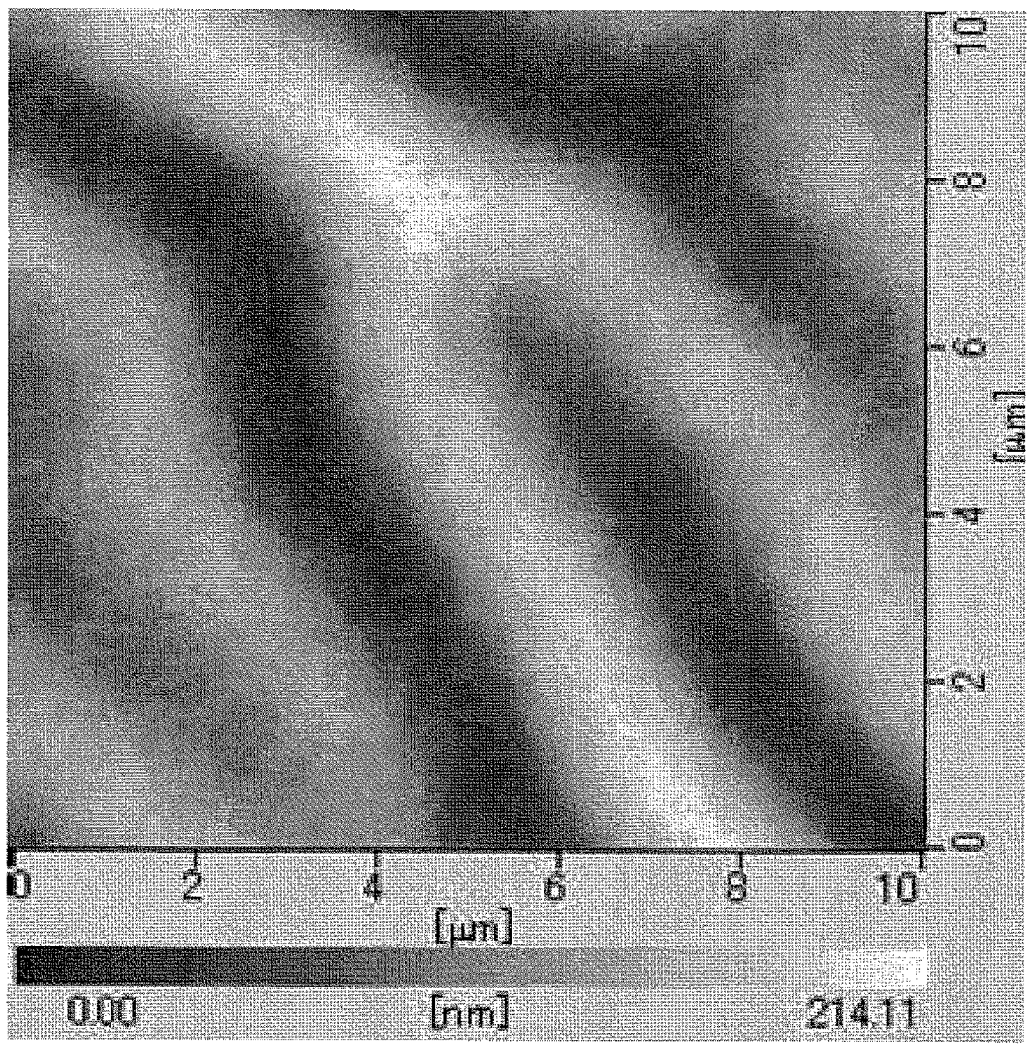
FIG. 5 is an image showing an SPM measurement result of a zinc oxide-formed substrate according to Comparative Example 3.

The zinc oxide-formed substrate was subjected to measurement using an SPM to obtain an image, which is shown in FIG. 5. Significant irregularity with a difference in height of about 200 nm was observed, and the surface roughness parameters obtained from the measurement result was such that Ra was 39.3 nm and RMS was 46.9 nm.

Figure 6:
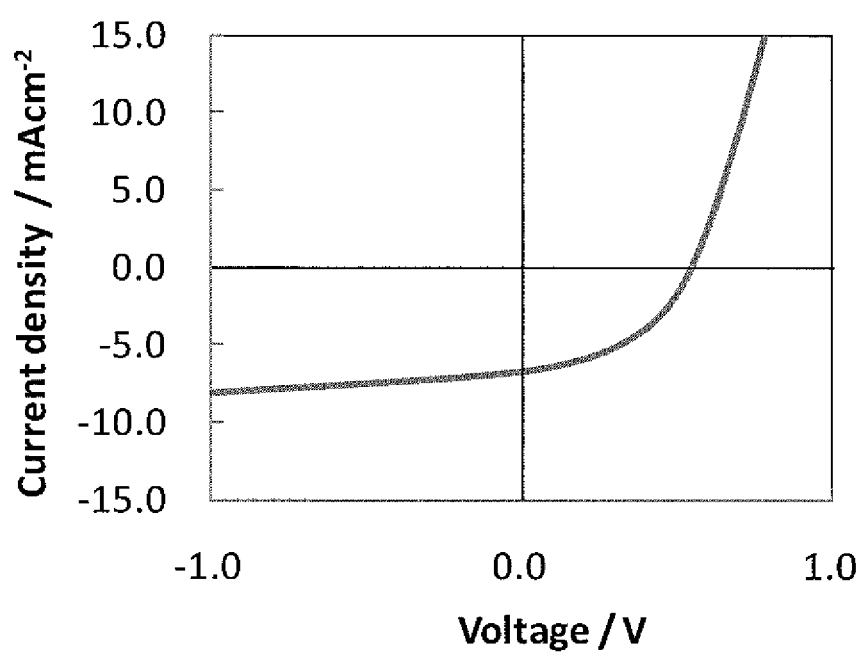
FIG. 6 is a graph showing an evaluation result of current-voltage characteristic of a solar cell panel according to Comparative Example 3.

With regard to the current-voltage characteristic, a photocurrent-voltage profile of the organic thin-film solar cell was obtained as shown in FIG. 6. Various parameters obtained on the basis of this photocurrent-voltage profile were shown in Table 1. Note that the photocurrent-voltage profile obtained from the solar cell panel according to the present example was not stable, and the repeatability was poor.

The invention claimed is:

1. A production method of a hole blocking layer, the hole blocking layer disposed between an organic semiconductor layer and an electrode connected electrically with the organic semiconductor layer in a photoelectric conversion element, the photoelectric conversion element comprising the organic semiconductor layer and the electrode, the hole blocking layer suppressing electrical conduction between the organic semiconductor layer and the electrode from being carried by holes, the production method comprising:
   a liquid layer forming step that causes a liquid composition and a surface of a member on which the hole blocking layer is to be formed at a temperature of lower than 50° C., to contact with each other thereby forming a liquid layer comprising the liquid composition on the surface of the member on which the hole blocking layer is to be formed, the liquid composition containing a zinc source comprising bis(acetylacetonato)zinc, a complexing agent comprising acetylacetone, and a polar solvent; and
   a drying step that heats the liquid layer formed by the liquid layer forming step to vaporize the complexing agent and the polar solvent from the liquid layer thereby forming a hole blocking layer comprising zinc oxide on the surface of the member on which the hole blocking layer is to be formed,
   wherein boiling point Tb1 at 1 atm of the polar solvent is 120° C. or higher and 160° C. or lower,
   wherein the drying step uses a heating temperature of about 100° C., and
   wherein the method of causing the liquid composition and the surface of the member to contact with each other in the liquid layer forming step is immersing the member in the liquid composition, applying the liquid composition to the surface of the member using a spray or roll or discharging liquid drops of the liquid composition to the surface of the member using ink-jet apparatus.

2. The production method of a hole blocking layer according to claim 1, wherein the polar solvent comprises alcohol.

3. The production method of a hole blocking layer according to claim 1, wherein the member on which the hole blocking layer is to be formed comprises a resin-based member configured of a resin-based material having a glass-transition temperature, the glass-transition temperature being a temperature higher than a heating temperature applied to the liquid layer in the drying step.

4. The production method of a hole blocking layer according to claim 3, wherein the resin-based member comprises polyethylene terephthalate.

5. The production method of a hole blocking layer according to claim 1, wherein the liquid layer forming step is performed under room temperature.

* * * * *